(12) United States Patent
Mimura et al.

(10) Patent No.: US 8,193,633 B2
(45) Date of Patent: Jun. 5, 2012

(54) HEAT CONDUCTIVE SHEET AND METHOD FOR PRODUCING SAME, AND POWDER MODULE

(75) Inventors: Kenji Mimura, Tokyo (JP); Hideki Takigawa, Tokyo (JP); Hiroki Shiota, Tokyo (JP); Kazuhiro Tada, Tokyo (JP); Takashi Nishimura, Tokyo (JP); Hiromi Ito, Tokyo (JP); Seiki Hiramatsu, Tokyo (JP); Atsuko Fujino, Tokyo (JP); Kei Yamamoto, Tokyo (JP); Motoki Masaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 197 days.

(21) Appl. No.: 12/675,549

(22) PCT Filed: Sep. 12, 2008

(86) PCT No.: PCT/JP2008/066551
§ 371 (c)(1),
(2), (4) Date: Feb. 26, 2010

(87) PCT Pub. No.: WO2009/041300
PCT Pub. Date: Apr. 2, 2009

(65) Prior Publication Data
US 2010/0226095 A1 Sep. 9, 2010

(30) Foreign Application Priority Data

Sep. 26, 2007 (JP) ................................ 2007-248927
Sep. 26, 2007 (JP) ................................ 2007-248936

(51) Int. Cl.
*H01L 23/34* (2006.01)
*H01L 23/10* (2006.01)

(52) U.S. Cl. ................ 257/707; 257/E23.101; 257/704; 257/706; 257/720; 438/122; 438/125

(58) Field of Classification Search .......... 257/E23.009, 257/E23.112, 500, 666, E23.101, E23.103, 257/E23.105, 704–707, 720; 428/209; 228/106, 228/180.1, 180.21, 180.22; 361/707; 165/185; 29/890.03; 438/121, 122, 125
See application file for complete search history.

(56) References Cited

U.S. PATENT DOCUMENTS 5,367,196 A * 11/1994 Mahulikar et al. ............ 257/787
(Continued)

FOREIGN PATENT DOCUMENTS
EP 0 794 227 A2 9/1997
(Continued)

OTHER PUBLICATIONS

Office Action issued Jul. 19, 2011 in German Application No. 11 2008 002 566.5 (With English Translation).

*Primary Examiner* — Chris Chu
(74) *Attorney, Agent, or Firm* — Oblon, Spivak, McClelland, Maier & Neustadt, L.L.P.

(57) ABSTRACT

Provided is a heat conductive sheet obtained by dispersing an inorganic filler in a thermosetting resin, in which the inorganic filler contains secondary aggregation particles formed by isotropically aggregating scaly boron nitride primary particles having an average length of 15 μm or less, and the inorganic filler contains more than 20 vol % of the secondary aggregation particles each having a particle diameter of 50 μm or more. The heat conductive sheet is advantageous in terms of productivity and cost and excellent in heat conductivity and electrical insulating properties.

7 Claims, 5 Drawing Sheets

U.S. PATENT DOCUMENTS

| | | | | |
|---|---|---|---|---|
| 5,719,442 A * | 2/1998 | Otsuki | | 257/712 |
| 6,054,520 A | 4/2000 | Washio et al. | | 524/404 |
| 6,225,701 B1 * | 5/2001 | Hori et al. | | 257/783 |
| 6,313,598 B1 * | 11/2001 | Tamba et al. | | 318/722 |
| 6,663,969 B2 * | 12/2003 | Masayuki et al. | | 428/414 |
| 6,713,088 B2 | 3/2004 | Lodyga et al. | | 424/489 |
| 6,794,030 B1 * | 9/2004 | Okada et al. | | 428/343 |
| 7,061,080 B2 * | 6/2006 | Jeun et al. | | 257/676 |
| 7,602,051 B2 | 10/2009 | Ito et al. | | 257/666 |
| 2003/0038278 A1 | 2/2003 | Ishihara | | 252/500 |
| 2005/0067719 A1 * | 3/2005 | Hayashi et al. | | 257/787 |

FOREIGN PATENT DOCUMENTS

| | | |
|---|---|---|
| JP | 6 12643 | 2/1994 |
| JP | 2002 80617 | 3/2002 |
| JP | 2003 60134 | 2/2003 |
| JP | 2003 113313 | 4/2003 |

* cited by examiner

HEAT CONDUCTIVE SHEET AND METHOD FOR PRODUCING SAME, AND POWDER MODULE

TECHNICAL FIELD

The present invention relates to a heat conductive sheet used for transferring heat from a heat-generating member of an electrical or electronic instrument or the like to a heat-dissipating member of the instrument or the like, and more specifically, to an insulative heat conductive sheet for conducting heat generated by a power module to a heat-dissipating member and a power module using the sheet.

BACKGROUND ART

A heat conductive resin film layer that transfers heat from a heat-generating member of an electrical or electronic instrument or the like to a heat-dissipating member of the instrument or the like is conventionally required to have high heat conductivity and insulating properties, and heat conductive sheets obtained by dispersing an inorganic filler in a thermosetting resin have been widely used to satisfy such demands. Here, hexagonal boron nitride (h-BN) having high heat conductivity and further an insulating property has been used as the inorganic filler.

The crystalline structure of hexagonal boron nitride is a layer structure similar to that of graphite, and the particles of hexagonal boron nitride are of scaly shapes. As illustrated in FIG. 10, the scaly boron nitrides each have such an anisotropic heat conductivity high in the length direction and low in the breadth direction. It is said that the heat conductivity in the length direction is several times to several tens of times as high as that in the breadth direction. In FIG. 10, the direction of the arrows represent the direction of heat conduction, and the thickness of the arrows represent the magnitude of the heat conduction. In view of the foregoing, the development of a heat conductive sheet having drastically improved heat conductivity in its thickness direction has been expected, which is attained by orienting the scaly boron nitrides dispersed in a thermosetting resin so that the scaly boron nitrides may be brought into such states as to stand upright in the sheet, that is, their length directions may coincide with the thickness direction.

However, in known molding methods for molding sheet shapes, such as press molding methods, injection molding methods, extrusion molding methods, calender molding methods, roll molding methods, or doctor blade molding methods, there is a tendency for the scaly boron nitrides in the thermosetting resin to be oriented in a state where the scaly boron nitrides topple over in the sheet, that is, such a state in which, as illustrated in FIG. 11, the length direction of the scaly boron nitride 5 may coincide with the sheet surface direction owing to pressure or flow at the time of molding. Accordingly, although a heat conductive sheet thus obtained may have excellent heat conductivity in its surface direction, there is a problem that the sheet cannot sufficiently exert its excellent heat conductivity when the sheet is used with the thickness direction as the heat conduction path.

In view of the foregoing, several methods for having the length directions of the scaly boron nitrides dispersed in the thermosetting resin coincide with the sheet thickness direction, that is, orienting the length directions of the scaly boron nitrides so that they stand upright in the sheet thickness direction have been proposed.

For example, in Patent Document 1, a heat conductive sheet, in which the length directions of scaly boron nitrides are oriented upright in its thickness direction, has been obtained by slicing in its thickness direction a sheet in which the length directions of the scaly boron nitrides are oriented so as to coincide with its surface direction.

In Patent Document 2, a heat conductive sheet in which the length directions of scaly boron nitrides are oriented upright in its thickness direction has been obtained by vertically cutting a laminated product obtained by winding a sheet in which the length directions of the scaly boron nitrides are oriented so as to coincide with its surface direction.

In Patent Document 3, a heat conductive sheet, in which the length directions of scaly boron nitrides are oriented parallel to its thickness direction by a magnetic field, has been obtained by applying the magnetic field in the thickness direction of the sheet before curing a polymer composition containing the scaly boron nitrides.

In Patent Document 4, a heat conductive sheet, in which the length directions of scaly boron nitrides are prevented from being oriented in its surface direction, has been obtained by shaking a composition containing organopolysiloxane and the scaly boron nitrides with an ultrasonic shaker before being cured.

Patent Document 5 proposes a heat conductive sheet in which an inorganic filler containing the secondary aggregation particles of scaly boron nitrides is blended.

Patent Document 1: JP 06-38460 B
Patent Document 2: JP 3568401 B
Patent Document 3: JP 2002-80617 A
Patent Document 4: JP 06-12643 B
Patent Document 5: JP 2003-60134 A

DISCLOSURE OF THE INVENTION

Problems to be Solved by the Invention

However, the methods disclosed in Patent Documents 1 to 4 are each disadvantageous in terms of productivity and cost because the methods each require a special facility and a complicated production process.

Meanwhile, when the average length of scaly boron nitride primary particles of which the secondary aggregation particles are formed is large in the method disclosed in Patent Document 5, the primary particles aggregate while facing the same direction, and the secondary aggregation particles are apt to collapse upon performance of, for example, mixing and stirring or pressing in a production process for the heat conductive sheet. Accordingly, heat conductivity in the thickness direction of the sheet is not sufficiently improved even by blending the secondary aggregation particles. In addition, the heat conductive sheet disclosed in Patent Document 5 does not have sufficient heat conductivity because the boron nitride powder as the inorganic filler contains only 1 to 20 wt % of secondary aggregation particles each having a particle diameter of 50 µm or more.

The present invention has been made with a view to solving such problems as described above, and an object of the present invention is to provide a heat conductive sheet and a method for producing same that is advantageous in terms of productivity and cost and excellent in heat conductivity and electrical insulating properties.

Another object of the present invention is to provide a power module excellent in heat-dissipating performance.

Means for Solving the Problems

The inventors of the present invention have made extensive studies with a view to solving such problems as described above. As a result, the inventors have found the following. When the average length of scaly boron nitride primary particles is set to 15 μm or less, the primary particles isotropically aggregate to provide secondary aggregation particles in which cohesive force between the primary particles is improved, and by dispersing an inorganic filler containing the secondary aggregation particles in a thermosetting resin, it is hard to collapse the secondary aggregation particles during the production process for a heat conductive sheet, and heat conductivity is equally improved in any direction of the heat conductive sheet. Further, the inventors have found that dispersing an inorganic filler containing more than 20 vol % of secondary aggregation particles each having a particle diameter of 50 μm or more in the thermosetting resin can drastically improve the heat conductivity of the heat conductive sheet.

That is, the present invention relates to a heat conductive sheet obtained by dispersing an inorganic filler in a thermosetting resin, in which the inorganic filler contains spherical secondary aggregation particles formed by isotropically aggregating and sintering scaly boron nitride primary particles having an average length of 15 μm or less, and the inorganic filler contains more than 20 vol % of the secondary aggregation particles having a particle diameter of 50 μm or more.

In addition, the present invention relates to a power module, including: a power semiconductor device mounted on one heat-dissipating member; another heat-dissipating member for dissipating heat generated by the power semiconductor device to externally; and the heat conductive sheet for transferring the heat generated by the semiconductor device from the one heat-dissipating member to the other heat-dissipating member.

Further, the present invention relates to a method for producing a heat conductive sheet, including: aggregating scaly boron nitride primary particles having an average length of 15 μm or less, and then sintering the resulting aggregations to form spherical secondary aggregation particles, adding and dispersing the inorganic filler containing more than 20 vol% of the secondary aggregation particles to a thermosetting resin composition containing a thermosetting resin to obtain a compound, applying the compound to a resin sheet or a heat-dissipating member, and then drying the resultant.

Effect of the Invention

According to the present invention there can be provided a heat conductive sheet and a method for producing same advantageous in terms of productivity and cost and excellent in heat conductivity and electrical insulating properties.

BEST MODE FOR CARRYING OUT THE INVENTION

Embodiment 1

Hereinafter, a heat conductive sheet in this embodiment is described with reference to the drawings.

Figure 1:
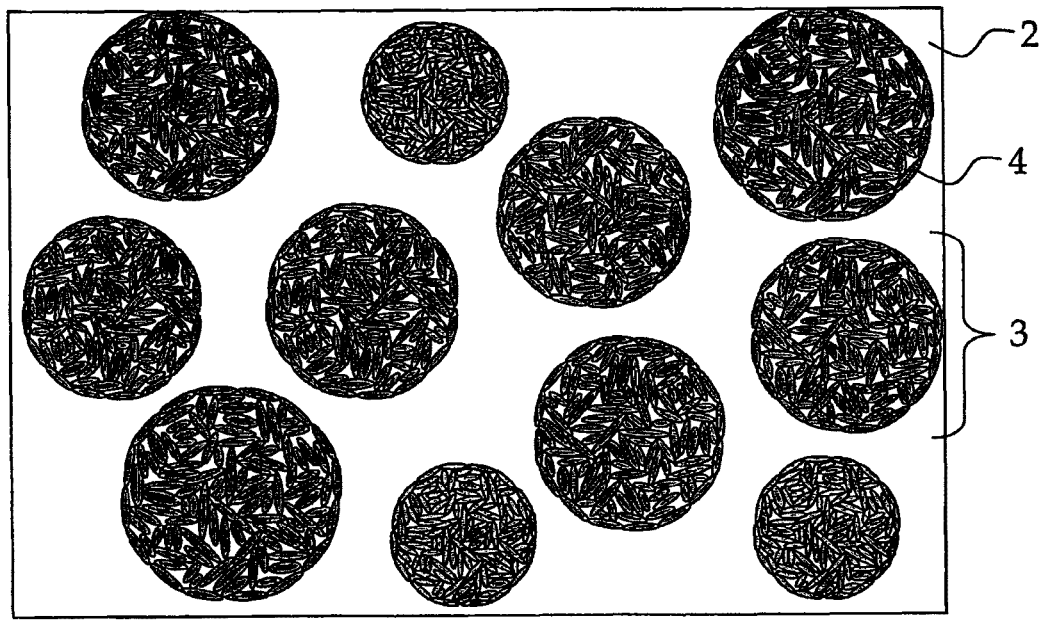
FIG. 1 is a schematic sectional view of a heat conductive sheet in Embodiment 1.

FIG. 1 is a schematic sectional view of a heat conductive sheet in this embodiment. In FIG. 1, a heat conductive sheet 1 is formed of a thermosetting resin 2 serving as a matrix and an inorganic filler which is secondary aggregation particles 3 of boron nitride dispersed in the thermosetting resin 2. The secondary aggregation particles 3 are formed by isotropic aggregation of scaly boron nitride primary particles 4.

Figure 2:
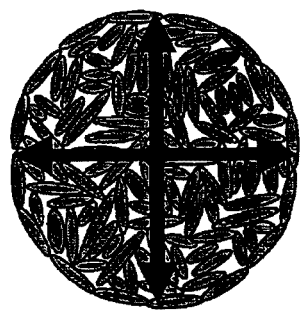
FIG. 2 is a schematic sectional view of a secondary aggregation particle formed of scaly boron nitride primary particles having an average length of 15 μm or less.

The average length of the scaly boron nitride primary particles 4 is 15 μm or less, and is preferably 0.1 μm to 10 μm. When the average length falls within this range, as illustrated in FIG. 2, the secondary aggregation particles 3 in which the scaly boron nitride primary particles 4 aggregate facing in various directions, that is, isotropically aggregate can be obtained, and hence the secondary aggregation particles 3 each have isotropic heat conductivity. Further, it is difficult for the secondary aggregation particles 3 to collapse upon performance of, for example, mixing and stirring or pressing in a process for producing the heat conductive sheet because the cohesive force between the primary particles 4 is strong. As a result, heat conductive sheets 1 obtained by blending the secondary aggregation particles 3 have improved heat conductivity in the thickness direction because the secondary aggregation particles 3 each having isotropic heat conductivity are uniformly dispersed without collapsing during the process for producing the heat conductive sheet 1. It should be noted that, in FIG. 2, the direction of the arrows represent the direction of heat conduction, and the thickness of the arrows represents the magnitude of heat conduction. In particular, when the average length of the scaly boron nitride primary particles 4 is 10 μm or less, the primary particles 4 can be isotropically and densely aggregated, and hence the heat conductivity of each of the secondary aggregation particles 3 becomes additionally isotropic, and it becomes even more difficult for the secondary aggregation particles 3 to collapse in the production process for the heat conductive sheet.

Figure 3:
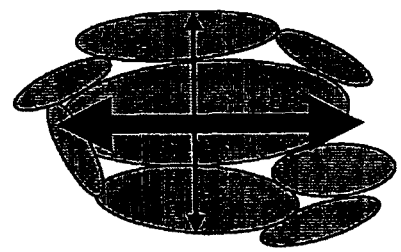
FIG. 3 is a schematic sectional view of a secondary aggregation particle formed of scaly boron nitride primary particles having an average length of more than 15 μm.

On the other hand, when the average length of the scaly boron nitride primary particles 4 is more than 15 as illustrated in FIG. 3, the scaly boron nitride primary particles 4 do not isotropically aggregate, and hence anisotropy appears in the heat conductivity of each of the secondary aggregation particles 3 (that is, heat conductivity in only a specific direction is raised). Further, the density of the secondary aggregation particles 3 is reduced, and hence the heat conductivity of each of the secondary aggregation particles 3 themselves is reduced, and the secondary aggregation particles 3 are apt to collapse in the production process for the heat conductive sheet. As a result, the heat conductive sheet 1 obtained by blending the secondary aggregation particles 3 does not show a sufficient improvement in heat conductivity in its thickness direction. It should be noted that, in FIG. 3, the direction of the arrows represents the direction of heat conduction, and the thickness of the arrows represents the magnitude of the heat conduction.

Here, a cohesive force between the primary particles 4 in each of the secondary aggregation particles 3 can be represented by a rate of change between the average particle diameters of the secondary aggregation particles 3 before and after the application of ultrasonic waves in laser diffraction/scattering particle size distribution measurement [(1−average particle diameter of secondary aggregation particles 3 after application of ultrasonic waves/average particle diameter of secondary aggregation particles 3 before application of ultrasonic waves)×100]. This is a calculation method based on such characteristics that, when the cohesive force between the primary particles 4 is weak, the secondary aggregation particles 3 are collapsed by the application of ultrasonic waves, and hence the average particle diameter of the secondary aggregation particles 3 after the application of ultrasonic waves becomes smaller than the average particle diameter of the secondary aggregation particles 3 before the application of ultrasonic waves. In contrast, when the cohesive force between the primary particles 4 is strong, the secondary aggregation particles 3 are not collapsed even by the application of ultrasonic waves, and hence the average particle diameter of the secondary aggregation particles 3 after the application of ultrasonic waves does not change as compared to that before the application. Here, ultrasonic waves are applied at a frequency of 22.5 kHz and an application time of 10 minutes.

The secondary aggregation particles 3 used in this embodiment are preferably such that the rate of change between the average particle diameters of the secondary aggregation particles 3 before and after the application of ultrasonic waves is 47% or less. When the rate of change between the average particle diameters exceeds 47%, the cohesive force between the primary particles 4 is so weak that most of the secondary aggregation particles 3 collapse in the production process for the heat conductive sheet, and desired heat conductivity cannot be obtained in the thickness direction of the heat conductive sheet 1 in some cases.

The secondary aggregation particles 3 can each be obtained by aggregating the scaly boron nitride primary particles 4 by a known method such as a spray drying method and subjecting the aggregate to sintering and grain growth. Here, the sintering temperature, which is not particularly limited, is generally about 2,000° C.

The shapes of the secondary aggregation particles 3 are spherical shapes. When the secondary aggregation particles 3 are spherical, the loading weight can be increased while the flowability of the resin is secured upon production of the heat conductive sheet 1.

The average particle diameter of the secondary aggregation particles 3 is preferably 20 μm to 180 μM, more preferably 40 μm to 130 μm. When the average particle diameter is less than 20 μm, a heat conductive sheet 1 having the desired heat conductivity cannot be obtained in some cases. On the other hand, when the average particle diameter exceeds 180 μM, it becomes difficult to mix and disperse the secondary aggregation particles 3 in the thermosetting resin 2, and hence the workability or moldability may be deteriorated. In addition, there may arise, for example, troubles in that a heat conductive sheet having the desired thickness cannot be obtained, or the electrical insulating properties of the sheet are reduced.

It should be noted that, when the maximum particle diameter of the secondary aggregation particles 3 is excessively large as compared to the thickness of the heat conductive sheet 1, the electrical insulating properties may be reduced due to conduction through an interface. Accordingly, the maximum particle diameter of the secondary aggregation particles 3 is preferably about 90% or less of the thickness of the heat conductive sheet 1.

In the heat conductive sheet 1, interfaces between each of the secondary aggregation particles 3 and the thermosetting resin 2 have large heat resistance, and hence heat transfer does not progress efficiently. Accordingly, when large amounts of the secondary aggregation particles 3 each having a small particle diameter are blended, numerous interfaces between the secondary aggregation particles 3 and the thermosetting resin 2 exist, and hence heat loss increases. Accordingly, the inorganic filler used in the heat conductive sheet 1 contains more than 20 vol %, preferably 30 vol % or more and less than 100 vol % of the secondary aggregation particles 3 each having a particle diameter of 50 μM or more. In the case where the secondary aggregation particles 3 each having a relatively large particle diameter are blended as described above, the number of interfaces between the secondary aggregation particles 3 and the thermosetting resin 2 is reduced as compared to that in the case where large amounts of the secondary aggregation particles 3 each having a small particle diameter are blended, and hence the heat resistance is suppressed and heat transfer progresses efficiently. As a result, the heat conductivity of the heat conductive sheet 1 drastically improves. When the content of the secondary aggregation particles 3 each having a particle diameter of 50 μm or more is 20 vol % or less, a heat conductive sheet 1 having the desired heat conductivity cannot be obtained.

In addition, increasing the particle diameter of a particulate inorganic filler having high heat conductivity generally reduces the electrical insulating properties of the heat conductive sheet. The reduction of the electrical insulating properties results from a difference in dielectric constant between the components of the heat conductive sheet. In the case of, for example, a heat conductive sheet in which particles each having a large particle diameter made of alumina or aluminum nitride having a dielectric constant (about 9) largely differs from that of the thermosetting resin (about 4) are blended as an inorganic filler, its electrical insulating properties are reduced. In contrast, in the case of a heat conductive sheet 1, in which the secondary aggregation particles 3 are blended as the inorganic filler, the thermosetting resin and the secondary aggregation particles 3 are comparable in dielectric constant to each other, specifically, they each have a dielectric constant of about 4, and hence the electrical insulating properties of the heat conductive sheet 1 are not reduced even when secondary aggregation particles 3 each having a relatively large particle diameter are blended.

Figure 4:
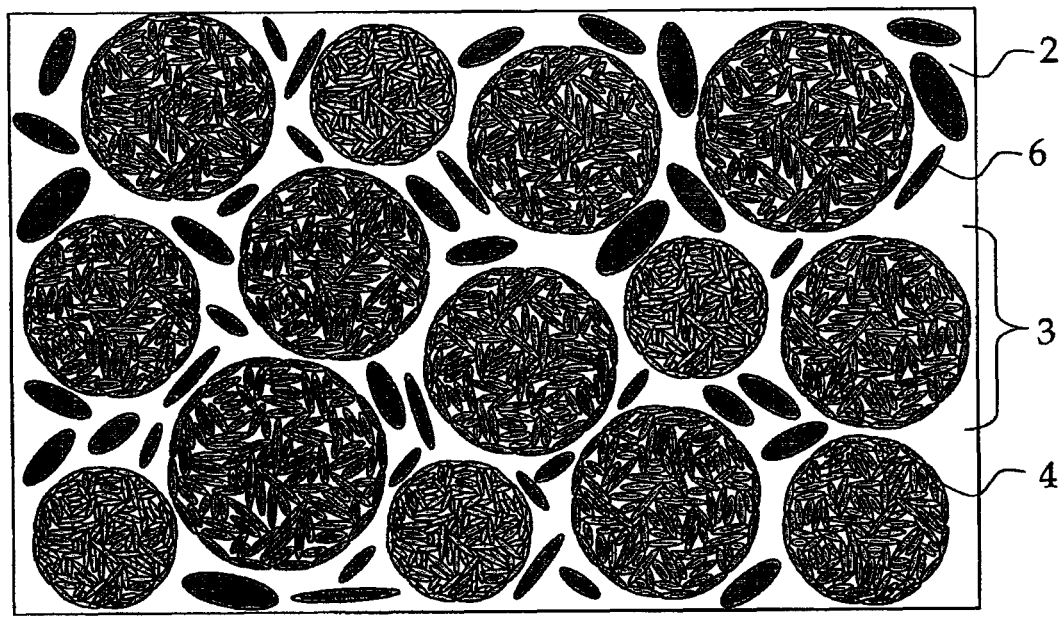
FIG. 4 is a schematic sectional view of another heat conductive sheet in Embodiment 1.

From the viewpoint of improvement in heat conductivity, the inorganic filler can contain scaly boron nitrides in addition to the scaly boron nitride primary particles 4 of which the above secondary aggregation particles 3 are formed. FIG. 4 illustrates a schematic sectional view of a heat conductive sheet further containing the scaly boron nitrides as the inorganic filler. In FIG. 4, a heat conductive sheet 5 is formed of the thermosetting resin 2 serving as a matrix and the inorganic filler containing the secondary aggregation particles 3 and scaly boron nitrides 6 dispersed in the thermosetting resin 2.

In addition, the secondary aggregation particles 3 are formed by isotropic aggregation of the scaly boron nitride primary particles 4.

The scaly boron nitrides each have a hexagonal crystalline structure because the scaly boron nitrides each have the quality of easily growing in their a-axis direction (length direction) during crystal growth. The heat conductivity of any such scaly boron nitride in its a-axis direction (length direction) is several times to several tens of times as high as that in its c-axis direction (breadth direction). In addition, when a heat conductive sheet is formed by dispersing only the scaly boron nitrides in a thermosetting resin, in general, heat conductivity in the thickness direction of the sheet is not improved because the length directions of the scaly boron nitrides are apt to be oriented so as to coincide with the surface direction of the sheet.

In contrast, in the heat conductive sheet 5 in this embodiment, the scaly boron nitrides 6 and the secondary aggregation particles 3 are blended as a mixture, and hence the length directions of the scaly boron nitrides 6 are difficult to orient parallel to the surface direction of the sheet. Accordingly, the length directions of the scaly boron nitrides 6 face in random directions, and some of the directions are oriented in the thickness direction of the sheet. As a result, the heat conductivity in the thickness direction of the sheet is additionally improved.

Here, when only the heat conductivity of each of the heat conductive sheets 1 and 5 is taken into consideration with regard to the degrees of orientation of the scaly boron nitrides in each of the heat conductive sheets 1 and 5 (the scaly boron nitride primary particles 4 or the scaly boron nitride primary particles 4 and the scaly boron nitrides 6), orienting all the length directions of the scaly boron nitrides parallel to the thickness direction of each of the heat conductive sheets 1 and 5 may be able to additionally improve the heat conductivity of the sheet.

However, when all the length directions of the scaly boron nitrides are oriented parallel to the thickness direction of each of the heat conductive sheets 1 and 5, the dielectric breakdown characteristic (electrical insulating properties) of the sheet are remarkably reduced, and hence the degree of orientation of the scaly boron nitrides in the sheet must be controlled while a balance between the heat conductivity and the dielectric breakdown characteristic is taken into consideration.

The degree of orientation of the scaly boron nitrides in each of the heat conductive sheets 1 and 5 can be evaluated with an X-ray diffraction apparatus. To be specific, the degree of orientation can be evaluated on the basis of an intensity ratio ($I_{<002>}/I_{<100>}$) of a diffraction peak on a <002> surface to a diffraction peak on a <100> surface in an X-ray diffraction pattern obtained by applying X-rays in the thickness direction of each of the heat conductive sheets 1 and 5. The intensity ratio ($I_{<002>}/I_{<100>}$) increases when the ratio, at which the length directions of the scaly boron nitrides are oriented parallel to the surface direction of each of the sheets, is large, and the intensity ratio decreases when the ratio, at which the length directions of the scaly boron nitrides are oriented parallel to the thickness direction of the sheet, is large.

The heat conductive sheets 1 and 5 in this embodiment each preferably have an intensity ratio ($I_{<002>}/I_{<100>}$) in the range of 6 to 20. When the intensity ratio is less than 6, the ratio at which the length directions of the scaly boron nitrides are oriented parallel to the thickness direction of each of the sheets is large, and hence the dielectric is breakdown characteristic reduced in some cases. On the other hand, when the intensity ratio exceeds 20, the ratio at which the length directions of the scaly boron nitrides are oriented parallel to the surface direction of the sheet is large, and hence the desired improving effect on heat conductivity in the thickness direction of the sheet cannot be obtained in some cases.

The average length of the scaly boron nitrides 6 used in the heat conductive sheet 5 is preferably 3 µm to 50 µm. When scaly boron nitrides 6 having an average length in this range are blended, the scaly boron nitrides 6 are loaded between the respective secondary aggregation particles 3 in a balanced fashion, and hence the heat conductivity of the heat conductive sheet 5 can be improved. In particular, the use of scaly boron nitrides 6 having an average length of 5 µm to 20 µm increases the filling fraction of the scaly boron nitrides 6, thereby additionally improving the heat conductivity of the heat conductive sheet 5. When the average length is less than 3 the specific surface area increases remarkably, and the number of interfaces between the matrix having a large heat resistance and the inorganic filler increases, and hence the desired improving effect on the heat conductivity of the heat conductive sheet 5 cannot be obtained in some cases. On the other hand, when the average length exceeds 50 µm, the scaly boron nitrides 6 each have so large a size that the scaly boron nitrides 6 barely load between the respective secondary aggregation particles 3 in a proper fashion.

Figure 5:
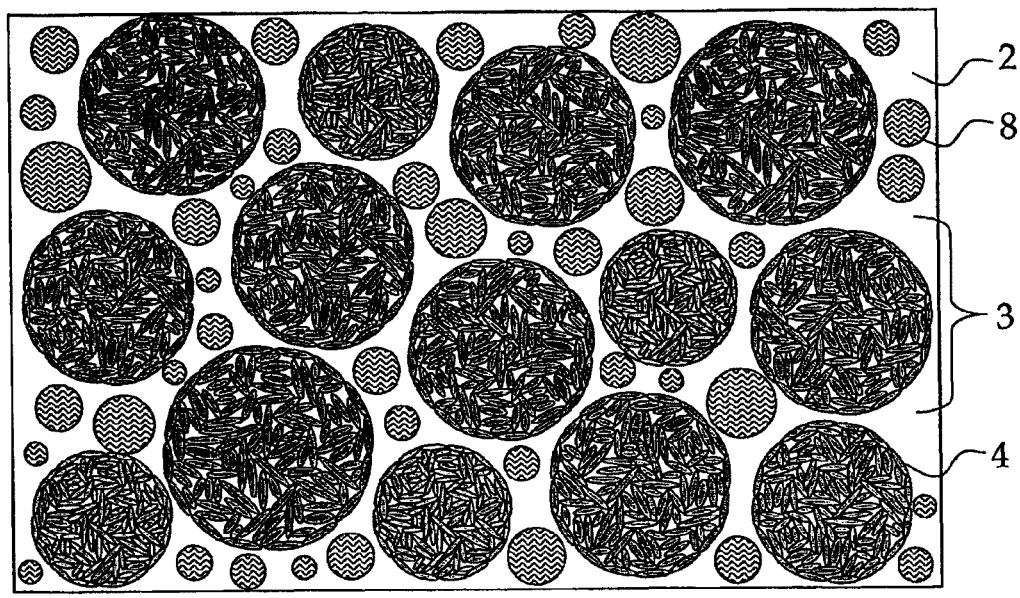
FIG. 5 is a schematic sectional view of still another heat conductive sheet in Embodiment 1.

From the viewpoint of an improvement in heat conductivity, the inorganic filler can contain inorganic powder. FIG. 5 illustrates a schematic sectional view of a heat conductive sheet further containing inorganic powder as the inorganic filler. In FIG. 5, a heat conductive sheet 7 is formed of the thermosetting resin 2 serving as a matrix and the inorganic filler containing the secondary aggregation particles 3 and inorganic powder 8 dispersed in the thermosetting resin 2. In addition, the secondary aggregation particles 3 are formed by isotropic aggregation of the scaly boron nitride primary particles 4.

The inorganic powder 8 used in the heat conductive sheet 7 is not particularly limited, and inorganic powder that can be generally used as an inorganic filler in a heat conductive sheet can be used. Mixing in the inorganic powder 8 can improve the heat conductivity of the heat conductive sheet 7 because the inorganic powder 8 is loaded between the respective secondary aggregation particles 3.

Examples of the inorganic powder 8 include fused silica ($SiO_2$), crystal silica ($SiO_2$), aluminum oxide ($Al_2O_3$), boron nitride (BN), aluminum nitride (AlN), and silicon carbide (SiC). In particular, boron nitride and aluminum nitride are preferred because they have excellent heat conductivity. In addition, the above compounds may be used alone or in combination.

The shape of the inorganic powder 8, which is not particularly limited either, is preferably spherical.

The filling fraction of the above inorganic filler in each of the heat conductive sheets 1, 5, and 7 is preferably 20 vol % to 80 vol %. The workability of the resin upon production of the heat conductive sheet 1, 5, or 7 is excellent, and the heat conductivity of the heat conductive sheet 1, 5, or 7 becomes good particularly when the filling fraction is 30 vol % to 70 vol %. When the filling fraction is less than 20 vol %, a heat conductive sheet 1, 5, or 7 having the desired heat conductivity cannot be obtained in some cases. In addition, when the filling fraction exceeds 80 vol %, it becomes difficult to mix and disperse the secondary aggregation particles 3 in the thermosetting resin 2 at the time of the production of the heat conductive sheet 1, 5, or 7, and hence the workability or moldability may be deteriorated.

The thermosetting resin 2 which forms the matrix of the heat conductive sheets 1, 5, and 7 is not particularly limited, and there may be used, for example, an epoxy resin, an unsaturated polyester resin, a phenol resin, a melamine resin, a silicone resin, and a polyimide resin. Among them, an epoxy resin is particularly preferred because it facilitates the production of the heat conductive sheets 1, 5, and 7.

As a main compound for the epoxy resin, there are exemplified a bisphenol A-type epoxy resin, a bisphenol F-type epoxy resin, an ortho-cresol novolac-type epoxy resin, a phenol novolac-type epoxy resin, an alicyclic aliphatic epoxy resin, and a glycidyl-aminophenol-based epoxy resin. These resins may be used alone or in combination.

As a curing agent used for the epoxy resin, there are exemplified alicyclic anhydrides such as methyltetrahydrophthalic anhydride, methylhexahydrophthalic anhydride, and himic anhydride; aliphatic anhydrides such as dodecenyl succinic anhydride; aromatic anhydrides such as phthalic anhydride and trimellitic anhydride; organic dihydrazides such as dicyandiamide and adipic acid dihydrazide; tris(dimethylaminomethyl)phenol; dimethylbenzylamine; 1,8-diazabicyclo(5,4,0)undecene and derivatives thereof; and imidazoles such as 2-methyl imidazole, 2-ethyl-4-methyl imidazole, and 2-phenyl imidazole. These curing agents may be used alone or in combination.

The loading of the curing agent only has to be appropriately adjusted in accordance with, for example, the kinds of thermosetting resin 2 and the curing agent to be used, and is generally 0.1 part by mass to 200 parts by mass with respect to 100 parts by mass of the thermosetting resin 2.

The heat conductive sheets 1, 5, and 7 may include a coupling agent from the viewpoint of improving adhesion of the interface between the thermosetting resin 2 and the secondary aggregation particles 3 of boron nitride. Examples of the coupling agent include γ-glycidoxypropyltrimethoxysilane, N-β(aminoethyl)γ-aminopropyltriethoxysilane, N-phenyl-γ-aminopropyltrimethoxysilane, and γ-mercaptopropyltrimethoxysilane. These coupling agents may be used alone or in combination.

The amount of the coupling agent to be added may be appropriately set in accordance with, for example, the kind of thermosetting resin 2 and coupling agent to be used. In general, the coupling agent may be added in an amount of 0.01 parts by mass to 5 parts by mass with respect to 100 parts by mass of the thermosetting resin 2.

The heat conductive sheet 1, 5, or 7 of this embodiment containing such components as described above can be produced as described below.

First, a thermosetting resin composition containing a predetermined amount of the thermosetting resin 2 and a curing agent in an amount needed for curing the thermosetting resin 2 is prepared.

Next, a solvent is added to the thermosetting resin composition so that a solution of the thermosetting resin composition may be prepared. The inorganic filler (specifically, the secondary aggregation particles 3, and arbitrarily the scaly boron nitrides 6 and the inorganic powders 8) is added to the solution, and the inorganic filler and the solution are preliminarily mixed. Here, the solvent used for preparing the solution of the thermosetting resin composition is not particularly limited, and toluene, methyl ethyl ketone, or the like can be used. The loading of the solvent is not particularly limited either as long as the preliminary mixing can be performed, and the loading is generally 40% by mass to 85% by mass with respect to the total mass of the thermosetting resin composition and the inorganic filler. It should be noted that the solvent need not be added when the viscosity of the thermosetting resin composition is low. In addition, when a coupling agent is blended in, the coupling agent has to be added prior to the following kneading step.

Next, the preliminarily mixed product is kneaded with, for example, a three-roll mill or a kneader so that a compound for a heat conductive sheet may be produced. After that, the compound is applied to, for example, a resin sheet subjected to a releasing treatment by a doctor blade method. Alternatively, the compound may be directly applied onto a heat-dissipating member.

Next, the applied product is dried so that the solvent in the applied product may be volatilized. As a result, the heat conductive sheet 1, 5, or 7 of this embodiment can be obtained. Here, the volatilization of the solvent may be expedited by heating the applied product to 80° C. to 150° C. as required upon drying. Alternatively, upon incorporation of the sheet into a power module or the like, the thermosetting resin 2 as a matrix may be brought into a B-stage state from the viewpoint of, for example, adhesiveness with each of a heat-generating member and a heat-dissipating member.

The heat conductive sheet 1, 5, or 7 of this embodiment thus produced can bond and electrically insulate the heat-generating member and heat-dissipating member of an electrical or electronic instrument when the sheet is placed between the heat-generating member and the heat-dissipating member. In particular, the heat conductive sheet 1, 5, or 7 of this embodiment can efficiently transfer heat from the heat-generating member to the heat-dissipating member because the sheet has high heat conductivity.

Here, when the heat conductive sheet 1, 5, or 7 of this embodiment is placed between the heat-generating member and heat-dissipating member of an electrical or electronic instrument, the heat-generating member and the heat-dissipating member can be bonded to the heat conductive sheet by using a heat conductive sheet whose thermosetting resin as a matrix is in a B-stage state, and by heating the heat conductive sheet to 150° C. to 200° C. so as to cure them after having been placed. In addition, the adhesiveness of each of the heat-generating member and heat-dissipating member of the electrical or electronic instrument with the heat conductive sheet can be additionally improved by bonding the heat conductive sheet to one of the heat-generating member and the heat-dissipating member, and by heating the heat conductive sheet to 150° C. to 200° C. so as to cure while the other of the heat-generating member and the heat-dissipating member is brought into press contact with the heat conductive sheet. It should be noted that, when it is not appropriate that the heat conductive sheet be brought into direct contact with the heat-generating member, another heat-generating member may be placed between the heat-generating member and the heat conductive sheet.

Embodiment 2

A power module of this embodiment includes: a power semiconductor device mounted on one heat-dissipating member; another heat-dissipating member for dissipating heat generated by the power semiconductor device to externally; and the above heat conductive sheet for transferring the heat generated by the power semiconductor device from the one heat-dissipating member to the other heat-dissipating member.

Figure 6:
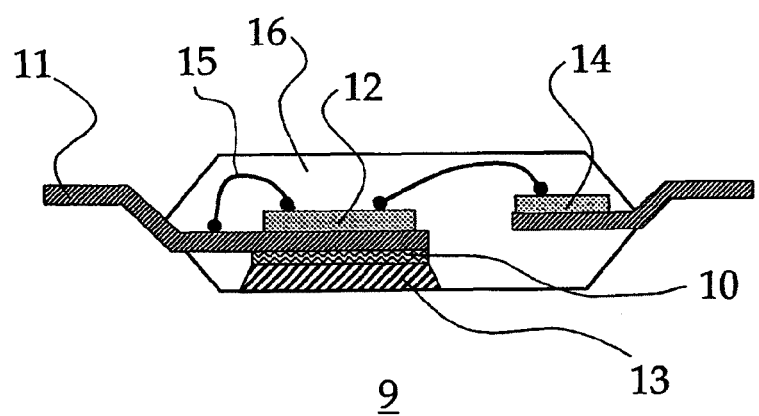
FIG. 6 is a schematic sectional view of a power module in Embodiment 2.

FIG. 6 is a schematic sectional view of the power module of this embodiment. In FIG. 6, a power module 9 includes: a power semiconductor device 12 mounted on a lead frame 11 as one heat-dissipating member; a heat sink 13 as another heat-dissipating member; and a heat conductive sheet 10 placed between the lead frame 11 and the heat sink 13. Further, the power semiconductor device 12 and a control semiconductor device 14 are bonded to each other with a metal wire 15, and the power semiconductor device 12 and the lead frame 11 are similarly bonded to each other with the metal wire 15. In addition, portions except the end of the lead frame 11 and a portion of the heat sink 13 for dissipating heat to the outside are sealed with a molded resin 16.

The power module 9 having such constitution is excellent in heat-dissipating performance because the module has the heat conductive sheet excellent in heat conductivity and insulating properties.

EXAMPLES

Hereinafter, details about the present invention are described by way of examples and comparative examples. However, the present invention is not limited by those examples.

Table 1 shows the kinds and characteristics of inorganic fillers used in Examples 1 to 18 and Comparative Examples 1 to 8. It should be noted that secondary aggregation particles having predetermined characteristics were produced with primary particles having any of the average length as shown in Table 1 by a known method. Here, the average length of primary particles was determined by embedding secondary aggregation particles in an epoxy resin to produce a sample, polishing a section of the sample, taking several photographs of the section with an electron microscope at a magnification of several thousand, actually measuring the length of the primary particles, and averaging the measured values.

that the inorganic filler might account for 60 vol % of the total volume of the thermosetting resin composition and the inorganic filler. Then, the solution and the inorganic filler were preliminarily mixed. The preliminarily mixed product was further kneaded with a three-roll mill. As a result, a compound for a heat conductive sheet was produced, in which the inorganic filler was uniformly dispersed in the solution of the thermosetting resin composition.

Next, the compound for a heat conductive sheet was applied onto a heat-dissipating member having a thickness of 105 μm by a doctor blade method, and the compound was subjected to a heat drying treatment at 110° C. for 15 minutes. As a result, a heat conductive sheet having a thickness of 100 μm and in a B-stage state was produced.

Next, two heat conductive sheets of this kind each formed on the heat-dissipating member and each in a B-stage state were superimposed so that the heat conductive sheet sides faced inward. After that, the resultant was heated at 120° C. for 1 hour, and further, the resultant was heated at 160° C. for 3 hours so that the thermosetting resin as a matrix for each heat conductive sheet was completely cured. As a result, a heat conductive sheet sandwiched between the two heat-dissipating members was obtained.

Examples 2 to 8

Heat conductive sheets each sandwiched between two heat-dissipating members were each obtained in the same

TABLE 1

| Kind | NO. | Average length of primary particles (μm) | Average particle diameter of secondary aggregation particles (μm) | Ratio of particles having particle diameter of 50 μm or more (vol %) |
|---|---|---|---|---|
| Secondary aggregation particles of boron nitride | A | 5 | 39 | 21 |
| | B | 6 | 50 | 46 |
| | C | 9 | 80 | 85 |
| | D | 12 | 130 | 99 |
| | E | 20 | 67 | 68 |
| | F | 18 | 51 | 48 |
| | G | 9 | 30 | 20 |
| | H | 8 | 40 | 13 |
| | I | 0.1 | 51 | 47 |
| | J | 0.8 | 53 | 51 |
| | K | 2 | 59 | 83 |
| | L | 15 | 56 | 55 |
| | M | 17 | 60 | 55 |
| Scaly boron nitrides | N | 9 | — | 0 |
| | O | 18 | — | 0 |

| Kind | NO. | Average particle diameter (μm) | Ratio of particles having particle diameter of 50 μm or more (vol %) |
|---|---|---|---|
| Spherical aluminum nitride | P | 30 | 17 |
| | Q | 80 | 75 |
| Molten silica | R | 15 | 20 |

Example 1

A thermosetting resin composition containing 100 parts by mass of a liquid bisphenol A-type epoxy resin (EPICOAT 828: manufactured by Japan Epoxy Resins Co., Ltd.) and 1 part by mass of 1-cyanoethyl-2-methylimidazole (Curezol 2PN-CN: manufactured by SHIKOKU CHEMICALS CORPORATION) as a curing agent was added to 166 parts by mass of methyl ethyl ketone as a solvent, and the mixture was stirred to prepare a solution of the thermosetting resin composition.

Next, secondary aggregation particles No. A of boron nitride as an inorganic filler were blended in the solution so manner as in Example 1 except that secondary aggregation particles Nos. B to D and I to L of boron nitride were each used as the inorganic filler.

Example 9

A heat conductive sheet sandwiched between two heat-dissipating members was obtained in the same manner as in Example 1 except that 78 parts by mass of methyl ethyl ketone were added upon preparation of a solution of the thermosetting resin composition, the secondary aggregation particles No. C of boron nitride were used as the inorganic filler, and the inorganic filler was blended in the solution so as to account for 30 vol % of the total volume of the thermosetting resin composition and the inorganic filler.

Example 10

A heat conductive sheet sandwiched between two heat-dissipating members was obtained in the same manner as in Example 1 except that 125 parts by mass of methyl ethyl ketone were added upon preparation of a solution of the thermosetting resin composition, the secondary aggregation particles No. C of boron nitride were used as the inorganic filler, and the inorganic filler was blended in the solution so as to account for 50 vol % of the total volume of the thermosetting resin composition and the inorganic filler.

Example 11

A heat conductive sheet sandwiched between two heat-dissipating members was obtained in the same manner as in Example 1 except that 234 parts by mass of methyl ethyl ketone were added upon preparation of a solution of the thermosetting resin composition, the secondary aggregation particles No. C of boron nitride were used as the inorganic filler, and the inorganic filler was blended in the solution so as to account for 70 vol % of the total volume of the thermosetting resin composition and the inorganic filler.

Comparative Example 1

In Comparative Example 1, a heat conductive sheet using only scaly boron nitrides as an inorganic filler was produced. Here, a heat conductive sheet sandwiched between two heat-dissipating members was obtained in the same manner as in Example 1 except that scaly boron nitrides No. N was used as the inorganic filler.

Comparative Examples 2 and 3

In each of Comparative Examples 2 and 3, a heat conductive sheet using an inorganic filler containing 20 vol % or less of secondary aggregation particles each having a particle diameter of 50 µm or more was produced. Here, heat conductive sheets each sandwiched between two heat-dissipating members were each obtained in the same manner as in Example 1 except that secondary aggregation particles No. H and G of boron nitride were each used as the inorganic filler.

Comparative Examples 4 to 6

In each of Comparative Examples 4 to 6, a heat conductive sheet using secondary aggregation particles formed by aggregating scaly boron nitride primary particles having an average length in excess of 15 µm as an inorganic filler was produced. Here, heat conductive sheets each sandwiched between two heat-dissipating members were each obtained in the same manner as in Example 1 except that secondary aggregation particles No. E, F, and M of boron nitride were each used as the inorganic filler.

Comparative Example 7

In Comparative Example 7, a heat conductive sheet using only scaly boron nitrides as an inorganic filler was produced by a conventional method. Here, a heat conductive sheet sandwiched between two heat-dissipating members was obtained in the same manner as in Example 1 except that only scaly boron nitrides No. O were used as the inorganic filler, and sheets were exposed to a magnetic atmosphere having a magnetic flux density of 4 T in which an N pole and an S pole were opposite to each other in the thickness direction of the sheets in the sheet drying step in accordance with the method of Patent Document 3.

Heat conductivity in the thickness direction of each of the heat conductive sheets obtained in Examples 1 to 11 and Comparative Examples 1 to 7 described above was measured by a laser flash method. Table 2 shows the results of the heat conductivities as relative values for the heat conductivities obtained in the heat conductive sheets of the respective examples and the respective comparative examples with reference to the heat conductivity obtained in the heat conductive sheet of Comparative Example 1 (value for "[heat conductivity obtained in heat conductive sheet of each example or each comparative example]/[heat conductivity obtained in heat conductive sheet of Comparative Example 1]").

In addition, the dielectric breakdown electric field (BDE) of each heat conductive sheet was calculated by dividing the dielectric breakdown voltage (BDV) measured by the following procedure by the thickness of the heat conductive sheet, in which a voltage was applied to the heat conductive sheet sandwiched between heat-dissipating members in oil at a constant rate of voltage increase of 1 kV/sec. Table 2 shows the results of the dielectric breakdown electric fields (BDEs) as relative values for the BDEs obtained in the heat conductive sheets of the respective examples and the respective comparative examples with reference to the BDE obtained in the heat conductive sheet of Comparative Example 7 (value for "[BDE obtained in heat conductive sheet of each example or each comparative example]/[BDE obtained in heat conductive sheet of Comparative Example 7]").

In addition, Table 2 shows the degrees of orientation of scaly boron nitrides in each heat conductive sheet as an intensity ratio between diffraction peaks ($I_{<002>}/I_{<100>}$) obtained by subjecting the heat conductive sheet to scanning with an X-ray diffraction apparatus and CuKα rays at 30 KV and 15 mA while a Bragg angle 2θ was set to 0 to 60°, and by determining the intensities of diffraction peaks at 26.9° on a <002> surface and at 41.6° on a <100> surface.

It should be noted that Table 2 summarizes, for example, the kinds and loadings of the components used in the respective examples and the respective comparative examples as well. In addition, the loadings are represented in units of "part(s) by mass."

TABLE 2

|  |  | Examples | | | | | | | | | | |
| --- | --- | --- | --- | --- | --- | --- | --- | --- | --- | --- | --- | --- |
|  |  | 1 | 2 | 3 | 4 | 5 | 6 | 7 | 8 | 9 | 10 | 11 |
| Thermosetting resin |  | 100 | 100 | 100 | 100 | 100 | 100 | 100 | 100 | 100 | 100 | 100 |
| Curing agent |  | 1 | 1 | 1 | 1 | 1 | 1 | 1 | 1 | 1 | 1 | 1 |
| Inorganic filler | A | 287 |  |  |  |  |  |  |  |  |  |  |
|  | B |  | 287 |  |  |  |  |  |  |  |  |  |
|  | C |  |  | 287 |  |  |  |  |  | 82 | 191 | 446 |

TABLE 2-continued

| Inorganic filler | | | | | | | | | | | |
|---|---|---|---|---|---|---|---|---|---|---|---|
| D | 287 | | | | | | | | | | |
| E | | | | | | | | | | | |
| F | | | | | | | | | | | |
| G | | | | | | | | | | | |
| H | | | | | | | | | | | |
| I | | | | | 287 | | | | | | |
| J | | | | | | 287 | | | | | |
| K | | | | | | | 287 | | | | |
| L | | | | | | | | 287 | | | |
| M | | | | | | | | | | | |
| N | | | | | | | | | | | |
| O | | | | | | | | | | | |
| Solvent | 166 | 166 | 166 | 166 | 166 | 166 | 166 | 166 | 78 | 125 | 234 |
| Filling fraction of inorganic filler in heat conductive sheet (vol %) | 60 | 60 | 60 | 60 | 60 | 60 | 60 | 60 | 30 | 50 | 70 |
| Average length of primary particles of which secondary aggregation particles are formed (μm) | 5 | 6 | 9 | 12 | 0.1 | 0.8 | 2 | 15 | 9 | 9 | 9 |
| Ratio of particles each having particle diameter of 50 μm or more in inorganic filler (vol %) | 23 | 46 | 85 | 99 | 47 | 51 | 83 | 55 | 85 | 85 | 85 |
| Intensity ratio between diffraction peaks ($I_{<002>}/I_{<100>}$) | 11.8 | 10.9 | 10.6 | 12.3 | 10.1 | 10.3 | 13.4 | 18.9 | 9.9 | 10.3 | 11.1 |
| Relative value for heat conductivity[1] | 1.50 | 2.17 | 2.58 | 2.75 | 2.02 | 1.95 | 2.38 | 1.73 | 1.33 | 1.92 | 2.83 |
| Relative value for dielectric breakdown electric field[2] | 7.4 | 7.0 | 6.7 | 6.0 | 7.2 | 7.2 | 6.9 | 7.1 | 7.5 | 6.9 | 6 |

| | Comparative Examples | | | | | | |
|---|---|---|---|---|---|---|---|
| | 1 | 2 | 3 | 4 | 5 | 6 | 7 |
| Thermosetting resin | 100 | 100 | 100 | 100 | 100 | 100 | 100 |
| Curing agent | 1 | 1 | 1 | 1 | 1 | 1 | 1 |
| Inorganic filler A | | | | | | | |
| B | | | | | | | |
| C | | | | | | | |
| D | | | | | | | |
| E | | | | | 287 | | |
| F | | | | | | 287 | |
| G | | | 287 | | | | |
| H | | 287 | | | | | |
| I | | | | | | | |
| J | | | | | | | |
| K | | | | | | | |
| L | | | | | | | |
| M | | | | | | 287 | |
| N | 287 | | | | | | |
| O | | | | | | | 287 |
| Solvent | 166 | 166 | 166 | 166 | 166 | 166 | 166 |
| Filling fraction of inorganic filler in heat conductive sheet (vol %) | 60 | 60 | 60 | 60 | 60 | 60 | 60 |
| Average length of primary particles of which secondary aggregation particles are formed (μm) | 9 | 8 | 9 | 20 | 18 | 17 | 18 |
| Ratio of particles each having particle diameter of 50 μm or more in inorganic filler (vol %) | 0 | 13 | 20 | 68 | 48 | 55 | 0 |
| Intensity ratio between diffraction peaks ($I_{<002>}/I_{<100>}$) | 68 | 12.2 | 12 | 61 | 56 | 58 | 5.2 |
| Relative value for heat conductivity[1] | 1 | 0.87 | 1.05 | 1.08 | 1.03 | 0.98 | 2.82 |
| Relative value for dielectric breakdown electric field[2] | 7.9 | 7.7 | 7.7 | 7.8 | 7.9 | 7.8 | 1 |

1) The value represents a relative value for the heat conductivity of a heat conductive sheet of each example or each comparative example with reference to the heat conductivity of the heat conductive sheet of Comparative Example 1, and can be determined by the following expression: [heat conductivity of heat conductive sheet of each example or each comparative example]/[heat conductivity of heat conductive sheet of Comparative Example 1].

2) The value represents a relative value for the dielectric breakdown electric field (BDE) of a heat conductive sheet of each example or each comparative example with reference to the BDE of the heat conductive sheet of Comparative Example 7, and can be determined by the following expression: [BDE obtained in heat conductive sheet of each example or each comparative example]/[BDE obtained in heat conductive sheet of Comparative Example 7].

As shown in Table 2, each of the heat conductive sheets of Examples 1 to 11 had a significantly high heat conductivity in their thickness direction as compared to the heat conductive sheet of Comparative Example 1 using only scaly boron nitrides as an inorganic filler, the heat conductive sheets of Comparative Examples 2 and 3 each using an inorganic filler containing 20 vol % or less of secondary aggregation particles each having a particle diameter of 50 μm or more, and the heat conductive sheets of Comparative Examples 4 to 6 each using secondary aggregation particles formed by aggregating scaly boron nitride primary particles having an average length in excess of 15 μm as an inorganic filler. It should be noted that the observation of a section of each of the heat conductive sheets of Comparative Examples 4 to 6 with an electron microscope confirmed that most of the secondary aggregation particles collapsed so as to be scaly.

By discussing the foregoing results, the ratio at which the length directions of the scaly boron nitrides are oriented parallel to the surface direction of each of the heat conductive sheets of Comparative Examples 1 and 4 to 6 is assumed to be large because each of the sheets has a large intensity ratio between diffraction peaks ($I_{<002>}/I_{<100>}$). Accordingly, the heat conductive sheets of Comparative Examples 1 and 4 to 6 may each have a reduced heat conductivity in their thickness direction.

Figure 9:
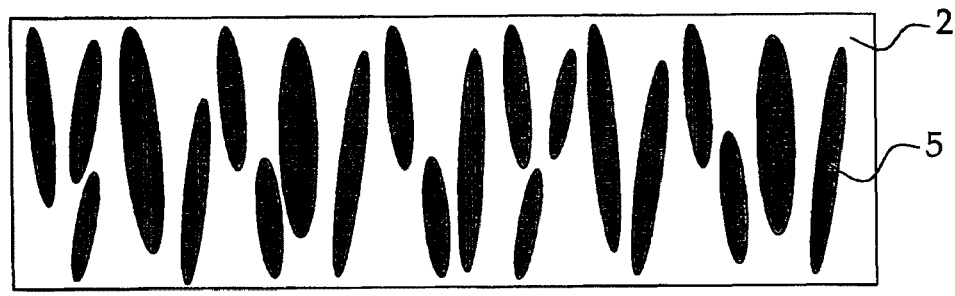
FIG. 9 is a schematic sectional view of a heat conductive sheet of Comparative Example 7.
Figure 10:
FIG. 10 is a view illustrating the heat conductivity of hexagonal boron nitride.
Figure 11:
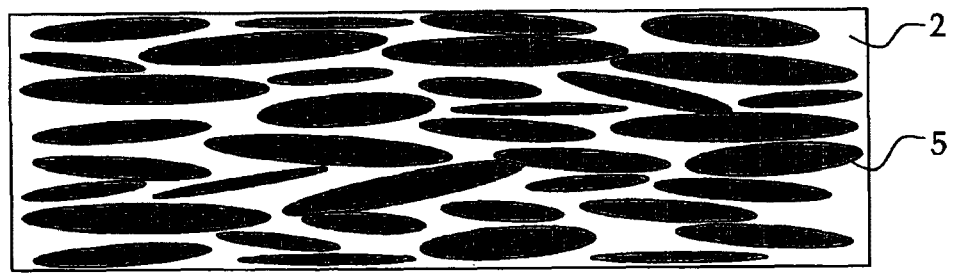
FIG. 11 is a schematic sectional view of a conventional heat conductive sheet.

In addition, the ratio at which the length directions of the scaly boron nitrides are oriented parallel to the thickness direction of the heat conductive sheet of Comparative Example 7 produced under a magnetic atmosphere in accordance with the method of Patent Document 3 is assumed to be large because the sheet has a small intensity ratio between diffraction peaks ($I_{<002>}/I_{<100>}$) Accordingly, the heat conductive sheet of Comparative Example 7 may have an increased heat conductivity in its thickness direction. As illustrated in FIG. 9, however, the ratio at which the length directions of the scaly boron nitrides are oriented parallel to the thickness direction of the heat conductive sheet of Comparative Example 7 is so large that the sheet has a reduced dielectric breakdown characteristic.

In contrast, the length directions of the scaly boron nitrides are assumed to be oriented in various directions such as the thickness direction and surface direction of each of the heat conductive sheets of Examples 1 to 11 in a balanced fashion because each of the sheets has an intensity ratio between diffraction peaks ($I_{<002>}/I_{<100>}$) of 6 to 20. Accordingly, the heat conductive sheets of Examples 1 to 11 may each have an increased heat conductivity in their thickness direction while maintaining a good dielectric breakdown characteristic.

Figure 7:
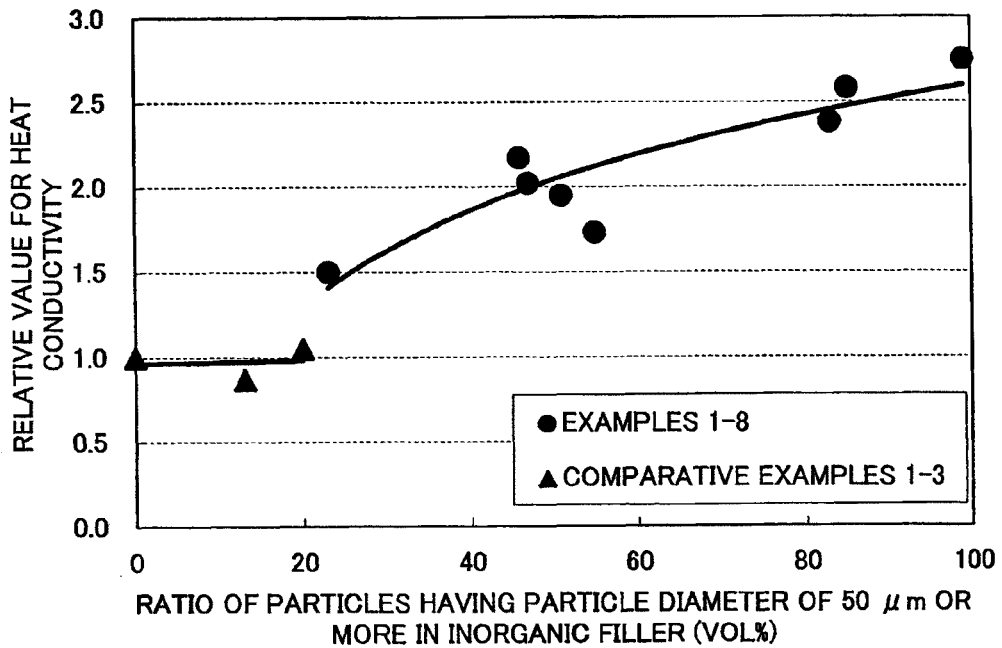
FIG. 7 is a view illustrating a relationship between a relative value for heat conductivity and a ratio of particles having a particle diameter of 50 μm or more in an inorganic filler in each of the heat conductive sheets of Examples 1 to 8 and Comparative Examples 1 to 3.
Figure 8:
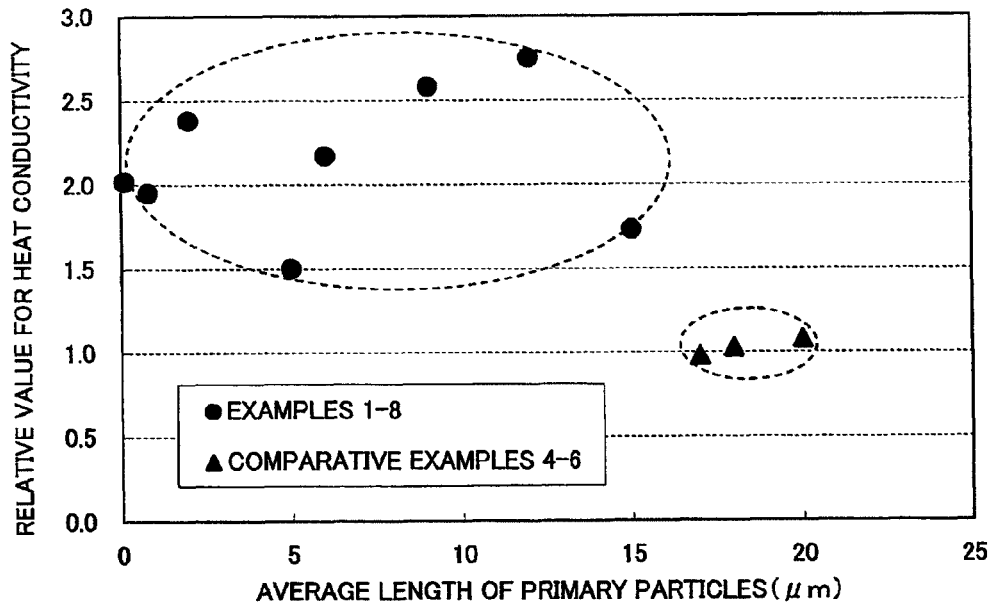
FIG. 8 is a view illustrating a relationship between a relative value for heat conductivity and the average length of primary particles in each of the heat conductive sheets of Examples 1 to 8 and Comparative Examples 4 to 6.

In addition, FIG. 7 illustrates a relationship between a relative value for a heat conductivity and a ratio of particles (meaning secondary aggregation particles in Examples 1 to 8 and Comparative Examples 1 to 3) each having a particle diameter of 50 μm or more in an inorganic filler in each of the heat conductive sheets of the examples and comparative examples on the basis of the results of Table 2. Further, FIG. 8 illustrates a relationship between the relative value for the heat conductivity and the average length of primary particles in each of the heat conductive sheets of Examples 1 to 8 and Comparative Examples 4 to 6.

As can be seen from FIG. 7, the relative value for the heat conductivity significantly increases when the ratio of particles (i.e., secondary aggregation particles) each having a particle diameter of 50 μm or more in an inorganic filler exceeds 20 vol %. Further, as can be seen from FIG. 8, the relative value for the heat conductivity significantly increases when the average length of the primary particles is 15 μm or less.

Example 12

A heat conductive sheet sandwiched between two heat-dissipating members was obtained in the same manner as in Example 1 except that a mixed filler obtained by mixing the secondary aggregation particles No. C of boron nitride and the scaly boron nitrides No. N at a volume ratio of 25:75 was used as the inorganic filler, and the mixed filler was blended in the solution so as to account for 60 vol % (No. C: 15 vol %, No. N: 45 vol %) of the total volume of the thermosetting resin composition and the mixed filler.

Example 13

A heat conductive sheet sandwiched between two heat-dissipating members was obtained in the same manner as in Example 1 except that a mixed filler obtained by mixing the secondary aggregation particles No. C of boron nitride and the scaly boron nitrides No. N at a volume ratio of 50:50 was used as the inorganic filler, and the mixed filler was blended in the solution so as to account for 60 vol % (No. C: 30 vol %, No. N: 30 vol %) of the total volume of the thermosetting resin composition and the mixed filler.

Example 14

A heat conductive sheet sandwiched between two heat-dissipating members was obtained in the same manner as in Example 1 except that 165 parts by mass of methyl ethyl ketone were added upon preparation of a solution of the thermosetting resin composition, a mixed filler obtained by mixing the secondary aggregation particles No. C of boron nitride and the scaly boron nitrides No. N at a volume ratio of 75:25 was used as the inorganic filler, and the mixed filler was blended in the solution so as to account for 60 vol % (No. C: 45 vol %, No. N: 15 vol %) of the total volume of the thermosetting resin composition and the mixed filler.

Example 15

A heat conductive sheet sandwiched between two heat-dissipating members was obtained in the same manner as in Example 1 except that 165 parts by mass of methyl ethyl ketone were added upon preparation of a solution of the thermosetting resin composition, a mixed filler obtained by mixing the secondary aggregation particles No. C of boron nitride and spherical aluminum nitride No. P at a volume ratio of 25:75 was used as the inorganic filler, and the mixed filler was blended in the solution so as to account for 60 vol % (No. C: 15 vol %, No. P: 45 vol %) of the total volume of the thermosetting resin composition and the mixed filler.

Example 16

A heat conductive sheet sandwiched between two heat-dissipating members was obtained in the same manner as in Example 1 except that 165 parts by mass of methyl ethyl ketone were added upon preparation of a solution of the thermosetting resin composition, a mixed filler obtained by mixing the secondary aggregation particles No. C of boron nitride, the scaly boron nitrides No. N, and spherical aluminum nitride No. Q at a volume ratio of 50:25:25 was used as the inorganic filler, and the mixed filler was blended in the solution so as to account for 60 vol % (No. C: 30 vol %, No. N: 15 vol %, No. Q: 15 vol %) of the total volume of the thermosetting resin composition and the mixed filler.

Example 17

A heat conductive sheet sandwiched between two heat-dissipating members was obtained in the same manner as in Example 1 except that 165 parts by mass of methyl ethyl ketone were added upon preparation of a solution of the thermosetting resin composition, a mixed filler obtained by mixing the secondary aggregation particles No. C of boron nitride and molten silica No. R at a volume ratio of 50:50 was used as the inorganic filler, and the mixed filler was blended in the solution so as to account for 60 vol % (No. C: 30 vol %, No. R: 30 vol %) of the total volume of the thermosetting resin composition and the mixed filler.

Example 18

A heat conductive sheet sandwiched between two heat-dissipating members was obtained in the same manner as in Example 1 except that 165 parts by mass of methyl ethyl ketone were added upon preparation of a solution of the thermosetting resin composition, a mixed filler obtained by mixing the secondary aggregation particles No. C of boron nitride, the scaly boron nitrides No. N, and the molten silica No. R at a volume ratio of 50:25:25 was used as the inorganic filler, and the mixed filler was blended in the solution so as to account for 60 vol % (No. C: 30 vol %, No. N: 15 vol %, No. R: 15 vol %) of the total volume of the thermosetting resin composition and the mixed filler.

Comparative Example 8

In Comparative Example 8, a heat conductive sheet using an inorganic filler containing 20 vol % or less of secondary aggregation particles each having a particle diameter of 50 µm or more was produced. A heat conductive sheet sandwiched between two heat-dissipating members was obtained in the same manner as in Example 1 except that a mixed filler obtained by mixing the secondary aggregation particles No. C of boron nitride and the scaly boron nitrides No. N at a volume ratio of 20:80 was used as the inorganic filler, and the mixed filler was blended in the solution so as to account for 60 vol % (No. C: 12 vol %, No. N: 48 vol %) of the total volume of the thermosetting resin composition and the mixed filler.

Heat conductivity in the thickness direction of each of the heat conductive sheets obtained in Examples 12 to 18 and Comparative Example 8 described above, and the dielectric breakdown voltage (BDV) and intensity ratio between X-ray diffraction peaks of each of the sheets were each measured in the same manner as that described above. Table 3 shows the results.

It should be noted that Table 3 summarizes, for example, the kinds and loadings of the components used in the respective examples and the respective comparative examples as well. In addition, the loadings are represented in units of "part(s) by mass."

TABLE 3

|  |  | Examples |  |  |  |  |  |  | Comparative Example |
|---|---|---|---|---|---|---|---|---|---|
|  |  | 12 | 13 | 14 | 15 | 16 | 17 | 18 | 8 |
| Thermosetting resin |  | 100 | 100 | 100 | 100 | 100 | 100 | 100 | 100 |
| Curing agent |  | 1 | 1 | 1 | 1 | 1 | 1 | 1 | 1 |
| Inorganic filler | C | 72 | 144 | 215 | 72 | 144 | 144 | 144 | 57 |
|  | N | 215 | 143 | 72 |  | 72 |  | 72 | 230 |
|  | P |  |  |  | 310 |  |  |  |  |
|  | Q |  |  |  |  | 207 |  |  |  |
|  | R |  |  |  |  |  | 139 | 70 |  |
| Solvent |  | 166 | 166 | 166 | 166 | 166 | 166 | 166 | 166 |
| Filling fraction of inorganic filler in heat conductive sheet (vol %) |  | 60 | 60 | 60 | 60 | 60 | 60 | 60 | 60 |
| Average length of primary particles of which secondary aggregation particles are formed (µm) |  | 9 | 9 | 9 | 9 | 9 | 9 | 9 | 9 |
| Ratio of particles each having particle diameter of 50 µm or more in inorganic filler (vol %) |  | 21 | 43 | 64 | 21 | 61 | 53 | 48 | 17 |
| Intensity ratio between diffraction peaks ($I_{<002>}/I_{<100>}$) |  | 19.9 | 17.2 | 14.0 | 10.7 | 14.2 | 11.0 | 13.8 | 53 |
| Relative value for heat conductivity[1] |  | 1.33 | 2.00 | 2.42 | 1.33 | 2.08 | 1.33 | 1.67 | 1.08 |
| Relative value for dielectric breakdown electric field[2] |  | 8.0 | 7.8 | 7.2 | 6.9 | 6.6 | 7.5 | 7.7 | 7.9 |

[1]The value represents a relative value for the heat conductivity of a heat conductive sheet of each example or each comparative example with reference to the heat conductivity of the heat conductive sheet of Comparative Example 1, and can be determined by the following expression: [heat conductivity of heat conductive sheet of each example or each comparative example]/[heat conductivity of heat conductive sheet of Comparative Example 1].
[2]The value represents a relative value for the dielectric breakdown electric field (BDE) of a heat conductive sheet of each example or each comparative example with reference to the BDE of the heat conductive sheet of Comparative Example 7, and can be determined by the following expression: [BDE obtained in heat conductive sheet of each example or each comparative example]/[BDE obtained in heat conductive sheet of Comparative Example 7].

As shown in Table 3, the heat conductive sheet of Comparative Example 8 using an inorganic filler containing secondary aggregation particles and scaly boron nitrides but containing 20 vol % or less of secondary aggregation particles each having a particle diameter of 50 µm or more had a low heat conductivity in its thickness direction.

In contrast, the heat conductive sheets of Examples 12 to 18 each using an inorganic filler containing secondary aggregation particles and scaly boron nitrides or inorganic powders and containing more than 20 vol % of secondary aggregation particles each having a particle diameter of 50 µm or more each had a high heat conductivity in their thickness directions. In particular, the length directions of the scaly boron nitrides are assumed to be oriented in various directions such as the thickness direction and surface direction of each of the heat conductive sheets of Examples 12 to 18 in a balanced fashion because each of the sheets has an intensity ratio between diffraction peaks ($I_{<002>}/I_{<100>}$) of 6 to 20. Accordingly, the heat conductive sheets of Examples 12 to 18 may each have increased heat conductivity in their thickness directions while maintaining a good dielectric breakdown characteristic.

Example 19

A power module was produced by sealing each of the heat conductive sheets each sandwiched between two heat-dissipating members (one of which was a lead frame and the other of which was a copper heat sink) of Examples 1 to 18 with a molded resin by a transfer molding method.

A thermocouple was attached to the lead frame and the center of the copper heat sink in each of the power modules. After that, the power module was operated, and the temperatures of both the lead frame and the heat sink were measured. As a result, each of the power modules using the heat conductive sheets of Examples 1 to 18 had a small temperature difference between the lead frame and the heat sink, and hence were excellent in heat-dissipating performance.

As can be seen from the foregoing results, the heat conductive sheet of the present invention is advantageous in terms of productivity and cost, and is excellent in heat conductivity and electrical insulating properties. In addition, the power module of the present invention is excellent in heat-dissipating performance.

The invention claimed is:

1. A heat conductive sheet comprising:
a thermosetting resin, and
an inorganic filler dispersed in the thermosetting resin,
wherein the inorganic filler contains spherical secondary aggregation particles, the spherical secondary aggregation particles comprising aggregates of scaly shaped boron nitride primary particles, wherein the spherical secondary aggregation particles comprise isotropic sintered aggregates of scaly shaped boron nitride primary particles having an average length of 15 µm or less, and wherein the inorganic filler contains more than 20 vol % of the secondary aggregation particles having a particle diameter of 50 µm or more.

2. A heat conductive sheet according to claim 1, wherein a filling fraction of the inorganic filler in the heat conductive sheet is 20 vol% to 80 vol %.

3. A heat conductive sheet according to claim 1, wherein the inorganic filler further contains scaly shaped boron nitrides having an average length of 3 µm to 50 µm.

4. A heat conductive sheet according to claim 1, wherein an intensity ratio ($I_{<002>}/I_{<100>}$) of a diffraction peak on a <002> surface to a <100> surface in an X-ray diffraction pattern obtained by applying X-rays in a thickness direction of the sheet is 6 to 20.

5. A heat conductive sheet according to claim 1, wherein the inorganic filler further contains inorganic powder.

6. A power module, comprising:
a power semiconductor device mounted on one heat-dissipating member;
another heat-dissipating member for dissipating heat generated by the power semiconductor device to externally; and
the heat conductive sheet according to claim 1 for transferring the heat generated by the semiconductor device from the one heat-dissipating member to the other heat-dissipating member.

7. A method for producing a heat conductive sheet, comprising:
aggregating scaly shaped boron nitride primary particles having an average length of 15 µm or less, and then sintering the resulting aggregations to form spherical secondary aggregation particles;
adding and dispersing the inorganic filler containing more than 20 vol % of the secondary aggregation particles to a thermosetting resin composition containing a thermosetting resin to obtain a compound; and
applying the compound to a resin sheet or a heat-dissipating member, and then drying the resultant.

* * * * *